United States Patent [19]

Sato et al.

[11] 4,068,186
[45] Jan. 10, 1978

[54] CIRCUIT FOR COMPENSATING FOR NONLINEAR CHARACTERISTICS IN HIGH-FREQUENCY AMPLIFIERS

[75] Inventors: Gunkichi Sato, Tanashi; Masahisa Yamaguchi, Tokyo, both of Japan

[73] Assignee: Kokusai Denshin Denwa Kabushiki Kaisha, Japan

[21] Appl. No.: 697,118

[22] Filed: June 17, 1976

[30] Foreign Application Priority Data

June 24, 1975 Japan .................................. 50-77826

[51] Int. Cl.² .............................................. H03F 1/26
[52] U.S. Cl. ..................................... 330/149; 330/151
[58] Field of Search ..................... 330/43, 124 R, 149, 330/151; 328/163; 325/46; 332/18, 37 R; 333/28 R

[56] References Cited

U.S. PATENT DOCUMENTS 3,675,138   7/1972   Standing .......................... 330/149 X
3,732,502   5/1973   Seidel ................................. 330/149
3,755,754   8/1973   Putz ................................... 330/149

Primary Examiner—James B. Mullins
Attorney, Agent, or Firm—Robert E. Burns; Emmanuel J. Lobato; Bruce L. Adams

[57] ABSTRACT

A circuit for compensating for the nonlinearity in a high-frequency amplifier, in which a pair of a first transmission line and a second transmission line respectively have a delay line and a nonlinear distortion generating high-frequency amplifier. An input signal is divided into two signal parts, which are respectively applied to the first transmission line and the second transmission line. The vector sum of respective outputs of the first transmission line and the second transmission line is obtained to provide a nonlinear characteristic for compensating for the amplitude and phase nonlinear characteristics in the high-frequency amplifier connected in cascade to this circuit.

11 Claims, 12 Drawing Figures

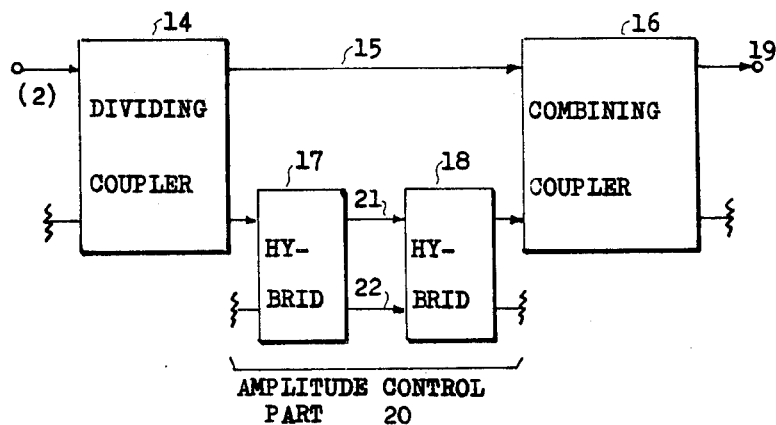
Fig.5
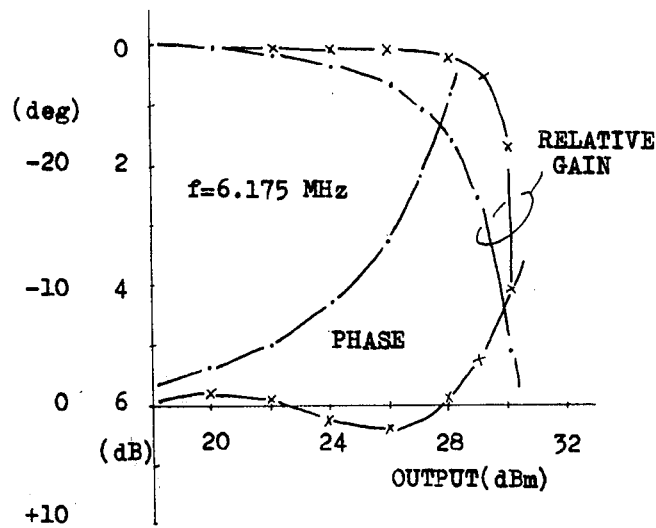
Fig.6
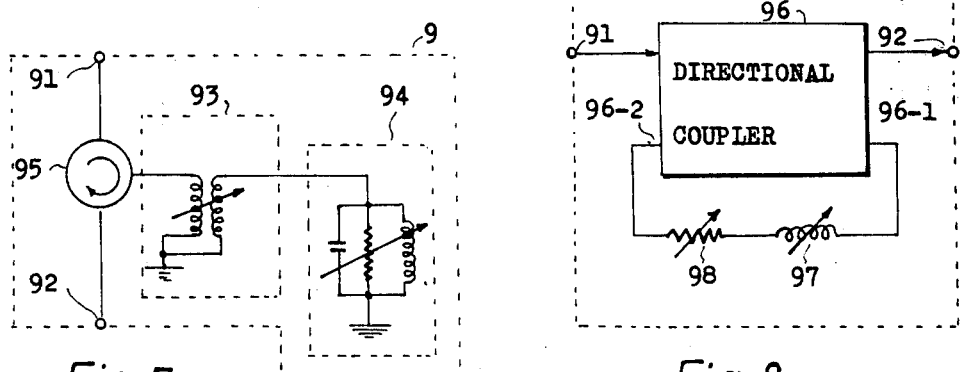
Fig.7
Fig.8

CIRCUIT FOR COMPENSATING FOR NONLINEAR CHARACTERISTICS IN HIGH-FREQUENCY AMPLIFIERS

FIELD OF THE INVENTION

This invention relates to a circuit for compensating for non-linear characteristics in high-frequency amplifiers, and more particularly to a circuit for compensating for amplitude nonlinearity and phase nonlinearity in a high-frequency amplifier.

BRIEF DESCRIPTION OF PRIOR ART

For the compensation for the nonlinear characteristics in ordinary amplifiers, a negative feedback method is the most excellent one in terms of performance. In the negative feedback method, however, the nonlinear characteristics in a high-frequency amplifier which has a time delay in itself, such as a travelling wave tube (hereinafter referred to as TWT), a klystron or the like, cannot be compensated over a wide band. Therefore, a variety of methods have recently been proposed for compensating for the nonlinear characteristics in high-frequency amplifiers to which the negative feedback method is difficult to apply.

Typical ones of conventional systems for compensating for the nonlinear characteristics in high-frequency amplifiers, which are capable of compensating for both of amplitude nonlinearity and phase nonlinearity in the amplifiers, are a system employing a feed-forward system and a system using a pre-distortion circuit.

In the feed-forward system, an input signal applied to an input terminal is divided by a reference coupler into two parts, which are applied to an error detection coupler through a main amplifier (a) to be compensated for and a delay line (c) for a reference path, respectively. The output signal of the main amplifier (a) is divided into two parts by the error detection coupler, and a greater one of the divided output parts is applied to an error injection coupler through a delay line (d). The remainder of the divided output parts is compared with the input signal applied to the error detection coupler through the delay line (c), by which its signal component is cancelled and only a distorted component generated in the main amplifier (a) is applied to an auxiliary amplifier (b). The distorted component amplified by the auxiliary amplifier (b) is applied to the error injection coupler and combined with the output signal applied thereto from the main amplifier through the delay line (d) so that the distorted component in the output signal of this system may be cancelled. This feed-forward system is an excellent method which enables not only compensation for the nonlinear characteristics in the high-frequency amplifier but also stabilization of its gain. However, this system requires two amplifiers of substantially the same performance and, from the economical and power-consumption points of view, this system is not suitable for the practical usage in compensation for nonlinear characteristics in a high-power amplifier.

On the other hand, the system using a pre-distortion circuit, that is, a system in which a pre-distortion circuit having nonlinear characteristics compensating for the supposed nonlinear characteristics of a high-frequency amplifier to be compensated is connected in cascade with the amplifier to provide linear overall input-output characteristics, has been recognized as most suitable for the compensation for the nonlinear characteristics in a high-power, high-frequency amplifier. Various circuits for the pre-distortion circuit have heretofore been proposed, and the most typical one of them adopts a dividing-combining method. In this method, an input signal applied to an input terminal is fed to a branching circuit, from which a part of the input signal is supplied to a detector but the remaining greater part of the input signal is divided into two parts by a dividing-coupler. The divided parts are applied to a power combining coupler through an amplitude or phase control element (g) and a delay line (e), respectively. At the same time, the abovesaid one part of the input signal is envelope-detected by the detector and its detected output is amplified by an amplifier to provide a control signal output. An output signal from the control element (g), whose amplitude or phase is controlled by the abovesaid control signal output, and the input signal component applied through the delay line (e) are combined with each other at the power combining coupler, thus obtaining nonlinear characteristics which compensate for the characteristics in the high-frequency amplifier to be compensated. The control element (g) for controlling the amplitude or phase of a radio-frequency signal is a variable attenuator formed with PIN diodes, or Schottky barrier diodes, or a variable phase shifter formed with a varactor diode. Accordingly, the pre-distortion circuit formed under the dividing-combining method has the following defects: (i) The characteristics of the control element (g) and the control part impose a limitation on the bandwidth in which the nonlinear characteristics can be compensated. (ii) Because of a difficulty in making the characteristic of the control element (g) variable, the level range in which the nonlinear characteristic can be compensated is narrow. (iii) Since the detected output of the input radio-frequency signal is used, it is difficult to compensate for the characteristics in a high-frequency amplifier whose nonlinear characteristics varies with frequency (which amplifier will hereinafter be referred to as the high-frequency amplifier having nonlinearity-frequency characteristic). Since conventional pre-distorters other than that employing the dividing-combining method also utilize the detected output of the input radio-frequency signal, they have the abovesaid defects.

BRIEF SUMMARY OF THE INVENTION

An object of this invention is to provide a circuit for compensating for nonlinear characteristics in high-frequency amplifiers, which circuit enables compensation for amplitude nonlinearlity and phase nonlinearity characteristics in a high-frequency amplifier and, in addition, permits compensation for such nonlinear characteristics even if they vary with frequency.

BRIEF DESCRIPTION OF THE DRAWINGS

The principle, construction and operation of this invention will be clearly understood from the following detailed description taken in conjunction with the accompanying drawings, in which:

FIG. 5 is a block diagram illustrating an example of an amplitude-frequency characteristic corrector employed in the embodiments shown in FIGS. 3A and 3B;

FIG. 6 is a characteristic diagram showing the results of experiments on the circuit of this invention; and FIGS. 7 and 8 are circuit diagrams each illustrating an example of a phase-frequency characteristic corrector employed in the embodiments shown in FIGS. 3A and 3B.

DETAILED DESCRIPTION OF THE INVENTION

Figure 1:
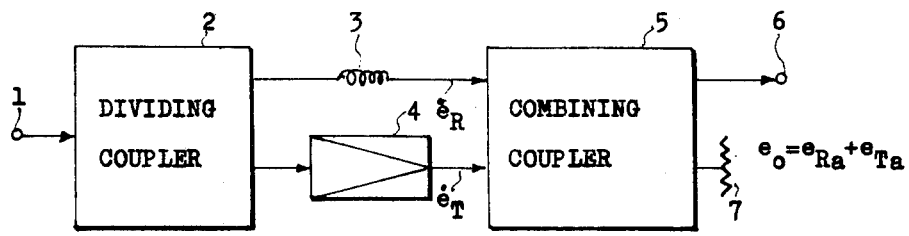
FIG. 1 is a block diagram illustrating the basic construction of the system of this invention.

With reference to FIG. 1 fundamental circuit structure of this invention will be described. This is a predistortion circuit which comprises first and second transmission lines, the former being a delay line 3 and the latter a nonlinear distortion generating high-frequency amplifier 4, a dividing-coupler 2 for dividing an input signal applied to a terminal 1 into two signal parts and for coupling them to input terminals of the two transmission lines respectively, and a combining coupler 5 for obtaining the vector sum of one portion of the output from the nonlinear distortion generating amplifier 4 and the input signal applied through the delay line 3. This pre-distortion circuit is provided to obtain the vector sum of nonlinear distorted components produced by a nonlinear characteristics in a wide-band, low-power, high-frequency amplifier and an input signal component and to obtain a nonlinear characteristics which compensates for the characteristics in a high-frequency amplifier to be compensated, and this circuit is connected in cascade to the high-frequency amplifier to be compensated to provide an overall linear input-output characteristic.

Figure 2:
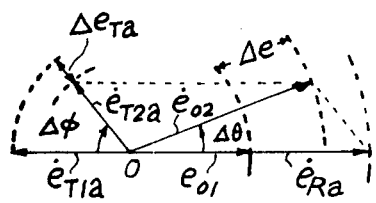
FIG. 2 is a vector diagram explanatory of the operation of the embodiment shown in FIG. 1.

The input signal applied to the input terminal 1 is divided by the dividing-coupler 2 and supplied to the combining coupler 5 through the delay line 3 of the first transmission line and the high-frequency amplifier 4 of the second transmission line, respectively. The output signal $\dot{e}_T$ from the high-frequency amplifier 4 and the input signal component $\dot{e}_R$ applied through the delay line 3 are respectively divided by the combining coupler 5. One part of them is terminated by a matching load 7, but the vector sum of the remaining signal components $\dot{e}_{Ta}$ and $\dot{e}_{Ra}$ arriving at the output terminal 6 is obtained as an output signal $\dot{e}_0$. In FIG. 2, there are shown the amplitude and phase relationships between the signal components $\dot{e}_{Ta}$ and $\dot{e}_{Ra}$ at the output terminal 6 which are normalized, for example, by the input signal. As shown in FIG. 2, while the high-frequency amplifier 4 performs a linear operation, the resulting output signal is indicated by a vector $\dot{e}_{01}$. On the other hand, in a case where the high-frequency amplifier 4 is shifted to a nonlinear operation range due to a change in the power of the input signal from the input terminal 1 while the amplitude of the resulting output signal component $\dot{e}_{Ta}$ decreases by $\Delta e_{Ta}$ and its phase decreases by $\Delta \phi$, the output signal becomes a vector $\dot{e}_{02}$. This vector $e_{02}$ is larger by $\Delta e$ in amplitude than the output signal $\dot{e}_{01}$ and advances in phase by $\Delta \theta$ with respect to the latter. That is, the input-output characteristic of this circuit presents nonlinear characteristics which are determined by the nonlinear characteristics in the high-frequency amplifier 4 and the combining conditions of the input signal component applied through the first transmission line and the output signal component of the high-frequency amplifier 4 of the second transmission line in the combining coupler 5 (i.e. the amplitude and phase relationships between these two signal components).

Since the nonlinear characteristic compensating circuit of this invention utilizes the nonlinear characteristics in a high-frequency amplifier in which it is easy to obtain a wide-band characteristic, the circuit has such advantages as follows: (i) The bandwidth in which the compensation is possible becomes equal to the bandwidth of the high-frequency amplifier for compensation, so that wide-band compensation can be readily achieved. (ii) Since the compensating circuit operates only in a radio-frequency band, it is easy to compensate for the nonlinear characteristics of a high-frequency amplifier. (iii) In a case where a TWT having an excellent wide-band characteristic is employed as the high-frequency amplifier for compensation, the nonlinear characteristics can be changed relatively easily by adjusting its operating voltage, especially its helix voltage, so that the range in which the nonlinear characteristics can be compensated is wide.

Figure 3A:
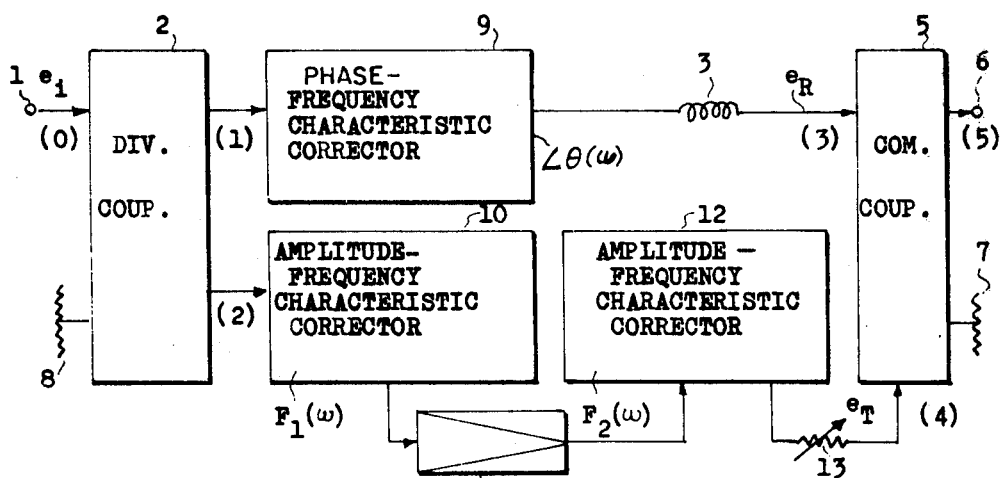
FIG. 3A is a block diagram illustrating a basic embodiment of this invention.

With reference to FIG. 3A, a basic embodiment of the non-linear characteristics compensating circuit of this invention is described, which employs, as the high-frequency amplifier for compensation, a low-power TWT using a helix slow wave circuit which has a wide-band and relatively flat nonlinear frequency characteristics. In FIG. 3A, 4-terminal directional couplers are employed as the input signal dividing-coupler 2 and the combining coupler 5, and the first transmission line interconnecting them comprises a phase-frequency characteristic corrector 9, a delay line 3, while the second transmission line comprises amplitude-frequency correctors 10 and 12, a low-power TWT 4 for generating nonlinear distortion and an attenuator 13. The phase-frequency characteristic corrector 9 and the amplitude-frequency characteristic correctors 10 and 12 are provided for generating the nonlinear characteristics which compensate for the characteristic of a high-frequency amplifier having the nonlinearity-frequency characteristic to be compensated. The transmission coefficients of respective parts in FIG. 3 are defined as follows:

Transmission coefficients between terminals (0) and (1) of the dividing coupler 2 and between terminals (3) and (5) of the combining coupler 5 . . . $T_{(0)(1)}$, $T_{(3)(5)}$ Coupling coefficients between terminals (0) and (2) of the dividing coupler 2 and between terminals (4) and (5) of the combining coupler 5 . . . $K_{(0)(2)} < \theta_0$, $K_{(4)(5)} < \theta_0$ TWT 4 for compensation . . . $G_2(v) < (\omega \tau_2 + \phi(v))$ Amplitude-frequency characteristics correctors 10, 12 . . . $F_1(\omega)$, $F_2(\omega)$ Phase-frequency characteristic corrector 9 . . . $< \theta_{(\omega)}$ Delay line 3 . . . $L_1 < \omega \tau_1$ Variable attenuator 13 . . . $L_2$ Further, if it is assumed that $\tau_1 = \tau_2$, that $2\theta_0 = \pi$, that $A_0 = T_{(0)(1)} \cdot L_1 \cdot G_1 T_{(3)(5)}$ and that $B(v, \omega) = K_{(0)(2)} \cdot F_1(\omega) \cdot G_2(v) \cdot F_2(\omega) \cdot L_2 \cdot K_{(4)(5)}$, the relationship between an output power $F_o$ of the compensating circuit and the input power $P_i$ thereto and a phase difference $\theta_{(0)-(5)}$ between the input and output are respectively given by the following equations (1) and (2):

$$\frac{P_o}{P_i} = (\frac{V_o}{V_i})^2 = A_o^2\{[\cos\theta(\omega) - \frac{B(V,\omega)}{A_o}\cos\phi(v)]^2$$

-continued
$$+ \{\sin\theta(\omega) - \frac{B(\nu,\omega)}{A_o}\sin\phi(\nu)\}^2] \quad (1)$$

$$\theta_{(0) - (5)} = \tan^{-1}\frac{\sin\theta(\omega) - \frac{B(\nu,\omega)}{A_o}\sin\phi(\nu)}{\cos\theta(\omega) - \frac{B(\nu,\omega)}{A_o}\cos\phi(\nu)} \quad (2)$$

Where $B(\nu,\omega)$ represents the amplitude nonlinearity in the TWT 4 and its amplitude nonlinearity-frequency characterstic which is provided by the amplitude-frequency characteristic correctors 10 and 12. Further, let it be assumed that the TWT 4 is its linear operation range and that when $F_1(\omega) \cdot F_2(\omega) = 1$, $B(\nu,\omega) = B_o$. Accordingly, it is sufficient only to adjust $B(\nu,\omega)$, $\theta(\omega)$, $\phi(\omega)$ and a ratio $B_o/A_o$ so that the nonlinear characteristics in the compensating circuit may be matched with the nonlinear characteristic of the high-frequency amplifier to be compensated.

Figure 4A:
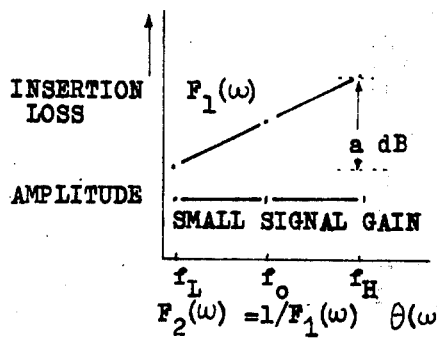
FIGS. 4A, 4B, 4C and 4D are characteristic diagrams explanatory of the operation of the embodiment shown in FIG. 3A.
Figure 4B:
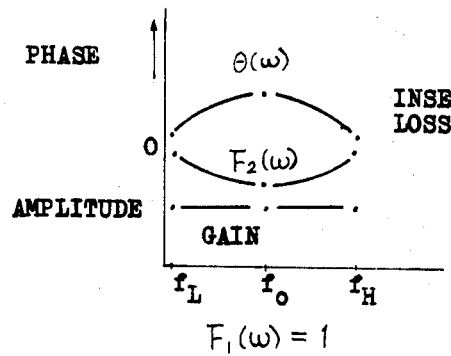
Figure 4C:
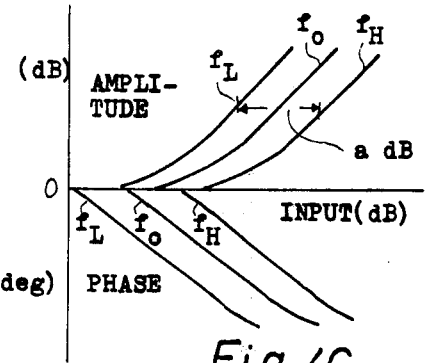
Figure 4D:
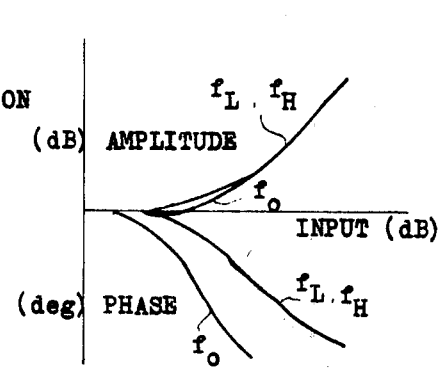

FIGS. 4A to 4D show examples of the nonlinearity-frequency characteristics in the compensating circuit with respect to the characteristics $(F_1(\omega), F_2(\omega), \theta(\omega))$ of the amplitude-frequency characteristic correctors 10 and 12 and the phase-frequency characteristic corrector 9 employed in the embodiment of FIG. 3A and the small signal gain-frequency characteristic of the compensating circuit when the low-power TWT 4 is in its linear operation range. That is, the loss-frequency characteristic of $F_1(\omega)$ is given in such a form as shown in FIG. 4A and the small signal gain-frequency characteristic of the compensating circuit in case of $F_2(\omega) = 1/F_1(\omega)$ and $\theta(\omega) = 0$ is flat as shown in FIG. 4A, but its nonlinear characteristics has such nonlinearity-frequency characteristic as depicted in FIG. 4C. The losses or the phase-frequency characteristics of $F_2(\omega)$ and $\theta(\omega)$ are such as shown in FIG. 4B. Further, the gain-frequency characteristic of the compensating circuit in case of $F_1(\omega) = 1$ can be made flat as depicted in FIG. 4B and its nonlinear characteristics can be rendered into such nonlinearity-frequency characteristics as shown in FIG. 4D which are different from that depicted in FIG. 4C.

The amplitude- or phase-frequency characteristic correctors for use in the compensating circuit of this invention should present the frequency characteristics only with respect to amplitude or phase so as to allow ease in the construction and adjustment of the compensating circuit. FIG. 5 illustrates an example of such a desirable amplitude-frequency characteristic corrector. An input signal applied to an input terminal (2) is divided by a dividing-coupler 14 into two signal parts. The one signal part is led to an output terminal 19 through an amplitude control part 20 and a combining coupler 16. In the amplitude control part, transmission lines 21 and 22 interconnecting a pair of 3dB hybrid couplers 17 and 18 have different electrical lengths to provide only an amplitude-frequency characteristics so that no phase distortion is caused. The other signal part is led to the output terminal 19 through a tranmission line 15 having the same electrical length as the amplitude control part 20. In this manner, the two signals parts are combined with each other by the combining coupler 16, so that this example performs the function of an amplitude-frequency characteristic corrector having an input-to-output phase characteristic equivalent to a line of a constant electrical length. Since this circuit enables the construction of amplitude-frequency characteristic correctors of mutually reverse characteristics, it is possible to form a system in which the transmission characteristic has no relation to frequency when this circuit is connected in cascade to an amplifier to be compensated.

Examples of the phase-frequency characteristic corrector 7 are shown in FIGS. 7 and 8. In FIG. 9, an input signal from an input terminal 91 is applied to a circulator 95 and obtained from an output terminal 92 after reflected by a coupling section 93 and a resonance circuit 94. In this example, if a phase change value for a frequency determined by the characteristics of the coupling section 93 and the resonance circuit 94 is included within a range of $\pm 10°$, this circuit has substantially a flat amplitude characteristic for a frequency range. In FIG. 8, the function performed by the coupling section 93 and the circulator 95 is replaced by a directional coupler 96. A part of an input signal from the input terminal 91 is applied to a resonance circuit, which is inserted between terminals 96-1 and 96-2 and is composed of a variable attenuator 97, 98 so that transfer characteristics between the terminals 91 and 92 are controlled. In the examples shown in FIGS. 7 and 8, Q and the resonance frequency of the resonance circuit are adjusted in addition to the degree of coupling of the resonance circuit with the main path between the terminals 91 and 92 to obtain substantially a flat amplitude characteristic for a frequency range.

Figure 3B:
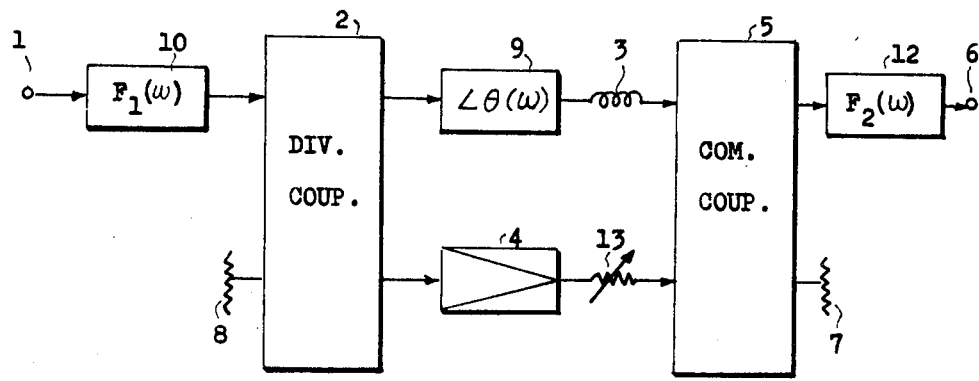
FIG. 3B is a block diagram illustrating another basic embodiment of this invention.

In the example shown in FIG. 3A, the amplitude-frequency characteristic correctors 10 and 12 are inserted in a path between the dividing coupler 2 and the combining coupler 5. However, if these amplitude-frequency characteristic correctors 10 and 12 are inserted, as shown in FIG. 3B between the input terminal 1 and the dividing coupler 2 and between the combining coupler 5 and the output terminal 6, respectively, a nonlinear characteristic having nonlinear frequency characteristics can be obtained.

FIG. 6 shows the results of experiments of the compensation for the nonlinearities in a TWT having a saturated output of about 1 W by the use of the compensating circuit of this invention which employed a 6 GHz, low-power TWT having flat gain-frequency characteristics in its amplifying bandwidth of 500MHz and the substantially flat nonlinearity frequency characteristics. In the experiments, the amplitude-and phase-frequency characteristic correctors 9, 10 and 12 shown in FIGS. 3A and 3B were not used. In FIG. 6, the one-dot chain line indicates the input-output characteristics in the TWT to be compensated and the x-mark chain line indicates measured values of the overall input-output characteristics when the compensating circuit of this invention was connected in cascade to the TWT to be compensated. Accordingly to experimental results of measurements of the inter-modulation products in case of common amplification of three CW waves, though not shown, the power ratio $P_o/P_s$ between a saturated output level $P_s$ of the TWT to be compensated at the time of the application thereto of a single CW wave and the composite output power $P_o$ was such that the quantity of the intermodulation products improved at a point 3.2dB was about 20dB. However, the TWT to be compensated employed in the experiments has a non-linearity-frequency characteristic and it is expected that the quantity of inter-modulation products improved can be increased by the compensation taking into account the abovesaid characteristic.

The compensating circuit of this invention has advantages such as a wide-band characteristic, a wide range in which the nonlinear characteristics in the amplifier to be compensated can be compensated and ease in the compensation for the nonlinearities in the high-frequency amplifier having the nonlinearity-frequency characteristic. Therefore, the compensating circuit of this invention is excellent as compared with a nonlinear characteristic compensating circuit of the conventional method which controls the amplitude or phase of an output radio-frequency signal by the use of a detected output of an input radio-frequency signal. Further, since the compensating circuit of this invention acts as a predistortion circuit, it is more economical than the circuit of the feed-forward system in case of compensating for the nonlinear characteristics in a high-power, high-frequency amplifier. And, the use of the compensating circuit of this invention enables the provision of a highly efficient high-power, wide-band, high-frequency amplifier.

What we claim is:

1. A circuit, compensating for nonlinearity in a high-frequency amplifier, comprising:
   input terminal means for receiving an input signal;
   dividing coupler means connected to said input terminal means for dividing the input signal into two signal parts;
   a first transmission line comprising a delay line and a phase-frequency characteristic corrector for developing nonlinear phase-frequency characteristics to compensate for a nonlinear characteristic of a high-frequency amplifier requiring compensation, connected to said dividing coupler means for compensation; one of said two signal parts;
   a second transmission line comprising a nonlinear distortion generating high-frequency amplifier for receiving the other of said two signal parts and for developing nonlinear amplitude-frequency characteristics to compensate for the nonlinear characteristic of the high-frequency amplifier requiring compensation;
   combining coupler means connected to said first transmission line and said second transmission line for obtaining the vector sum of respective outputs of said first transmission line and said second transmission line; and
   output terminal means connected to said combining coupler means for sending out said vector sum to the highfrequency amplifier connected in cascade to said output terminal means for compensating for the amplitude and phase nonlinear characteristics in the high-frequency amplifier requiring compensation.

2. A circuit for compensating for nonlinearity in a high-frequency amplifier comprising:
   input terminal means for receiving an input signal;
   dividing coupler means connected to said input terminal means for dividing the input signal into two signal parts;
   a first transmission line comprising a delay line connected to said dividing coupler means for receiving one of said two signal parts, and comprising a phase-frequency characteristics corrector, which comprises a circulator inserted in the main path thereof and a resonance circuit coupled to said circulator, for developing nonlinear phase-frequency characteristics to compensate for a nonlinear characteristic of a high-frequency amplifier requiring compensation;
   a second transmission line comprising a nonlinear distortion generating high-frequency amplifier for receiving the other of said two signal parts and for developing nonlinear amplitude-frequency characteristics to compensate for the nonlinear characteristic of the high-frequency amplifier requiring compensation;
   combining coupler means connected to said first transmission line and said second transmission line for obtaining the vector sum of respective outputs of said first transmission line and said second transmission line; and
   output terminal means connected to said combining coupler means for sending out said vector sum to the high-frequency amplifier connected in cascade to said output terminal means for compensating for the amplitude and phase nonlinear characteristics in the high-frequency amplifier requiring compensation.

3. A circuit for compensating for nonlinearity in a high-frequency amplifier comprising:
   input terminal means for receiving an input signal;
   dividing coupler means connected to said input terminal means for dividing the input signal into two signal parts;
   a first transmission line comprising a delay line connected to said dividing coupler means for receiving one of said two signal parts;
   a second transmission line comprising a first amplitude-frequency characteristic corrector, a nonlinear distortion generating high-frequency amplifier and a second amplitude-frequency characteristic corrector connected in cascade in the named order for receiving the other of said two signal parts and for developing nonlinear amplitude-frequency characteristics to compensate for a nonlinear characteristic of a high-frequency amplifier requiring compensation;
   combining coupler means connected to said first transmission line and said second transmission line for obtaining the vector sum of respective outputs of said first transmission line and said second transmission line; and
   output terminal means connected to said combining coupler means for sending out said vector sum to the high frequency amplifier connected in cascade to said output terminal means for compensating for the amplitude and phase nonlinear characteristics in the high-frequency amplifier requiring compensation.

4. A circuit for compensating for nonlinearity in a high-frequency amplifier comprising:
   input terminal means for receiving an input signal;
   dividing coupler means connected to said input terminal means for dividing the input signal into two signal parts;
   a first transmission line comprising a delay line connected to said dividing coupler means for receiving one of said two signal parts;
   a second transmission line comprising a nonlinear distortion generating high-frequency amplifier and a first amplitude-frequency characteristic corrector connected before said nonlinear distortion generating high-frequency amplifier for receiving the other of said two signal parts, said first amplitude-frequency characteristic corrector comprising a dividing coupler for dividing its input signal into two divided signal parts, amplitude control means receptive to one of said two divided signal parts and comprising two control transmission lines having different electrical lengths, a division signal path receptive of the other of said two divided signal parts and having an electrical length substantially equal to that of said amplitude control means, and a combining coupler connected to said amplitude control means and said division signal path for combining respective outputs of said amplitude control means and said division signal path for developing nonlinear amplitude-frequency characteristics to compensate for a nonlinear characteristic of a high-frequency amplifier requiring compensation;

combining coupler means connected to said first transmission line and said second transmission line for obtaining the vector sum of respective outputs of said first transmission line and said second transmission line; and output terminal means connected to said combining coupler means for sending out said vector sum to the high frequency amplifier connected in cascade to said output terminal means for compensating for the amplitude and phase nonlinear characteristics in the high-frequency amplifier requiring compensation.

5. A circuit for compensating for nonlinearity in a high-frequency amplifier comprising:

input terminal means for receiving an input signal;

dividing coupler means connected to said input terminal means for dividing the input signal into two signal parts;

a first transmission line comprising a delay line connected to said dividing coupler means for receiving one of said two signal parts;

a second transmission line comprising a nonlinear distortion generating high-frequency amplifier for receiving the other of said two signal parts;

combining coupler means connected to said first transmission line and said second transmission line for obtaining the vector sum of respective outputs of said first transmission line and said second transmission line;

an amplitude-frequency characteristic corrector connected to the output of said combining coupler means and receptive of said vector sum for developing nonlinear amplitude frequency characteristics to compensate for a nonlinear characteristic of a high-frequency amplifier requiring compensation; and output terminal means connected to said amplitude-frequency characteristic corrector for sending out the output of said amplitude-frequency characteristic corrector to the high frequency amplifier connected in cascade to said output terminal means for compensating for the amplitude and phase nonlinear characteristics in the high-frequency amplifier requiring compensation.

6. A circuit for compensating for nonlinearity in a high-frequency amplifier comprising:

input terminal means for receiving an input signal;

a first amplitude-frequency characteristic corrector connected to said input terminal means;

dividing coupler means connected to said first amplitude-frequency characteristic corrector for dividing the output of said first amplitude-frequency characteristic corrector into two signal parts;

a first transmission line comprising a delay line connected to said dividing coupler means for receiving one of said two signal parts;

a second transmission line comprising a nonlinear distortion generating high-frequency amplifier for receiving the other of said two signal parts;

combining coupler means connected to said first transmission line and said second transmission line for obtaining the vector sum of respective outputs of said first transmission line and said second transmission line;

a second amplitude-frequency characteristic corrector connected to the output of said combining coupler means and receptive of said vector sum, said second amplitude-frequency characteristic corrector comprising a dividing coupler for dividing its input signal in to two divided signal parts, amplitude control means receptive of one of said two divided signal parts and comprising two control transmission lines having different electrical lengths, a division signal path receptive of the other of said two divided signal parts and having an electrical length substantially equal to that of said amplitude control means, and a combining coupler connected to said amplitude control means and said division signal path for combining respective outputs of said amplitude control means and said division signal path for developing nonlinear amplitude-frequency characteristics to compensate for a nonlinear characteristic of a high-frequency amplifier requiring compensation; and output terminal means connected to said amplitude-frequency characteristics corrector for sending out the output of said second amplitude-frequency characteristic corrector to the high frequency amplifier connected in cascade to said output terminal means for compensating for the amplitude and phase nonlinear characteristics in the high-frequency amplifier requiring compensation.

7. A circuit for compensating for nonlinearity in a high-frequency amplifier comprising:

input terminal means for receiving an input signal;

divising coupler means connected to said input terminal means for dividing the input signal into two signal parts;

a first transmission line comprising a delay line connected to said dividing coupler means for receiving one of said two signal parts and comprising a phase-frequency characteristic corrector, which comprises a directional coupler inserted in the main path thereof and a resonance circuit coupled to said directional for developing nonlinear phase-frequency characteristics to compensate for a nonlinear characteristic of a high-frequency amplifier requiring compensation;

a second transmission line comprising a nonlinear distortion generating high-frequency amplifier for receiving the other of said two signal parts;

combining coupler means connected to said first transmission line and said second transmission line for obtaining the vector sum of respective outputs of said first transmission line and said second transmission and for developing nonlinear amplitude-frequency characteristics to compensate for the nonlinear characteristic of a high-frequency amplifier requiring compensation; and output terminal means connected to said combining coupler means for sending out said vector sums to the high-frequency amplifier connected in cascade to said output terminal means for compensating for the amplitude and phase nonlinear characteristics in the high-frequency amplifier requiring compensation.

8. A circuit according to claim 7, further comprising a amplitude-frequency characteristic corrector inserted between said combining coupler and said output terminal means.

9. A circuit for compensating for nonlinearity in a high-frequency amplifier comprising:
input terminal means for receiving an input signal;
dividing coupler means connected to said input terminal means for dividing the input signal into two signal parts;
a first transmission line comprising a delay line connected to said dividing coupler means for receiving one of said two signal parts and a phase-frequency characteristic corrector for generating a nonlinear phase-frequency characteristics to compensate for a nonlinear characteristic of a high-frequency amplifier requiring compensation;
a second transmission line comprising a first amplitude-frequency characteristic corrector, a nonlinear distortion generating high-frequency amplifier and a second amplitude-frequency characteristic corrector connected in cascade in the named order for receiving the other of said two signal parts and for developing nonlinear amplitude-frequency characteristics to compensate for the nonlinear characteristic of the high frequency amplifier requiring compensation;
combining coupler means connected to said first transmission line and said second transmission line for obtaining the vector sum of respective outputs of said first transmission line and said second transmission line; and
output terminal means connected to said combining coupler means for sending out said vector sum to the high frequency amplifier connected in cascade to said output terminal means for compensating for the amplitude and phase nonlinear characteristics in the high-frequency amplifier requiring compensation.

10. A circuit according to claim 9, in which said second amplitude-frequency characteristic corrector comprises a dividing coupler for dividing its input signal into two divided signal parts, amplitude control means receptive of one of said two divided signal parts and comprising two control transmission lines having different electrical lengths, a division signal path receptive of the other of said two divided signal parts and having an electrical length substantially equal to that of said amplitude control means, and a combining coupler connected to said amplitude control means and said division signal path for combining respective outputs of said amplitude control means and said division signal path.

11. A circuit according to claim 9, in which said first amplitude-frequency characteristic corrector comprises a divising coupler for dividing its input signal into two divided signal parts, amplitude control means receptive of one of said two divided signal parts and comprising two control transmission lines having different electrical lengths, a division signal path receptive of the other of said two divided signal parts and having an electrical length substantially equal to that of said amplitude control means, and a combining coupler connected to said amplitude control means and said division signal path for combining respective outputs of said amplitude control means and said division signal path.

* * * * *